(12) United States Patent
Huang et al.

(10) Patent No.: US 11,224,127 B2
(45) Date of Patent: Jan. 11, 2022

(54) FLEXIBLE PRINTED CIRCUIT BOARD AND ELECTRONIC DEVICE USING THE SAME

(71) Applicant: PEGATRON CORPORATION, Taipei (TW)

(72) Inventors: Mao-Hsiang Huang, Taipei (TW); Wei-Chih Hsu, Taipei (TW); Pen-Uei Lu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/870,842

(22) Filed: May 8, 2020

(65) Prior Publication Data
US 2021/0029827 A1    Jan. 28, 2021

(30) Foreign Application Priority Data

Jul. 22, 2019  (TW) .................................. 108125786

(51) Int. Cl.
*H05K 1/18*   (2006.01)
*H05K 1/14*   (2006.01)
*H05K 1/02*   (2006.01)

(52) U.S. Cl.
CPC ............. *H05K 1/147* (2013.01); *H05K 1/028* (2013.01); *H05K 1/189* (2013.01)

(58) Field of Classification Search
CPC ......... H05K 1/147; H05K 1/028; H05K 1/189
USPC ....................................................... 361/749
See application file for complete search history.

(56) References Cited

U.S. PATENT DOCUMENTS

| | | | |
|---|---|---|---|
| 6,583,990 B2* | 6/2003 | Serizawa ............. | H01R 12/616 174/260 |
| 2007/0019076 A1* | 1/2007 | Teramoto ............... | H05K 1/028 348/207.99 |
| 2010/0263462 A1* | 10/2010 | Nakamura ............. | G01D 15/00 73/866.5 |

FOREIGN PATENT DOCUMENTS

| | | |
|---|---|---|
| CN | 102014177 | 4/2011 |
| CN | 102801007 | 11/2012 |
| JP | 2003309332 | 10/2003 |
| JP | 2006286768 | 10/2006 |
| TW | 522763 | 3/2003 |

(Continued)

OTHER PUBLICATIONS

"Search Report of Europe Counterpart Application", dated Dec. 23, 2020, p. 1-p. 9.

(Continued)

*Primary Examiner* — Binh B Tran
(74) *Attorney, Agent, or Firm* — J.C. Patents

(57) ABSTRACT

A flexible printed circuit board and an electronic device using the same are provided. The electronic device includes a first casing, a second casing, and a printed circuit board combination. The printed circuit board combination includes a first printed circuit board, a second printed circuit board, and a flexible printed circuit board. The flexible printed circuit board includes a body portion, a first extending end, and a second extending end. The body portion defines an opening. The first extending end bends from a first side of the body portion toward the body portion and extends toward a first direction after passing through the opening to connect the first printed circuit board. The second extending end extends from a second side of the body portion toward a second direction to connect the second printed circuit board.

15 Claims, 6 Drawing Sheets

(56) References Cited

FOREIGN PATENT DOCUMENTS

WO 2008149500 12/2008

OTHER PUBLICATIONS

"Office Action of Japan Counterpart Application", dated Aug. 3, 2021, p. 1-p. 4.

* cited by examiner

FLEXIBLE PRINTED CIRCUIT BOARD AND ELECTRONIC DEVICE USING THE SAME

CROSS-REFERENCE TO RELATED APPLICATION

This application claims the priority benefit of Taiwan application serial no. 108125786, filed on Jul. 22, 2019. The entirety of the above-mentioned patent application is hereby incorporated by reference herein and made a part of this specification.

BACKGROUND

1. Technology Field

The disclosure relates to an electronic device, and in particular to a printed circuit board combination and an electronic device using the same.

2. Description of Related Art

In an adjustable or retractable electronic device, since a casing of the electronic device needs to reciprocate to extend or retract, a flexible printed circuit board having a foldable effect is usually used to connect two printed circuit boards. In the casing of the electronic device, the flexible printed circuit board is usually folded into a z shape, so the flexible printed circuit board may be deformed correspondingly as the casing of the electronic device extends or retracts. However, since the casing of the electronic device needs multiple reciprocating motions, the flexible printed circuit board often may not be well restored to an original shape, and may be stuck or even creased, affecting an use effect of the flexible printed circuit board.

SUMMARY OF THE DISCLOSURE

The disclosure provides a printed circuit board combination with novel architecture.

The disclosure provides an electronic device having a longer service life.

A flexible printed circuit board of the disclosure is configured to connect a first printed circuit board and a second printed circuit board. The flexible printed circuit board includes a body portion, a first extending end and a second extending end. The body portion defines an opening. The first extending end bends from a first side of the body portion toward the body portion and extends toward a first direction after passing through the opening to connect the first printed circuit board. The second extending end extends from a second side of the body portion toward a second direction to connect the second printed circuit board.

An electronic device of the disclosure includes a first casing, a second casing and a printed circuit board combination. The first casing and the second casing are assembled together in a relatively movable manner. The printed circuit board combination includes a first printed circuit board, a second printed circuit board and the flexible printed circuit board. The first printed circuit board is fixed in the first casing, and the second printed circuit board is fixed in the second casing. A first extending end bends toward a body portion and extends toward a first direction after passing through an opening to connect the first printed circuit board.

In an embodiment of the disclosure, the first side and the second side are two opposite sides of the body portion, and the second direction is a reverse direction of the first direction.

In an embodiment of the disclosure, the first extending end and the second extending end are symmetrically disposed on two opposite sides of the body portion. Alternatively, the first extending end and the second extending end are disposed in a staggered manner in a width direction of the body portion.

In an embodiment of the disclosure, a width of the first extending end and a width of the second extending end are less than a width of the body portion.

In an embodiment of the disclosure, a width of the opening is greater than the width of the first extending end.

In an embodiment of the disclosure, the first side and the second side are two opposite sides of the body portion, and the second direction is perpendicular to the first direction.

Based on the above, in the printed circuit board combination and the electronic device using the same according to the disclosure, the printed circuit board combination uses the novel architecture, so that the flexible printed circuit board therein is folded in a manner similar to a curved L-shape and connected to the printed circuit board, and is then used in the electronic device. Therefore, the flexible printed circuit board may smoothly extend or retract with the reciprocating motion of the casing, and will not be stuck or creased, causing damage to a circuit structure on the flexible printed circuit board.

To make the features and advantages of the disclosure clear and easy to understand, the following gives a detailed description of embodiments with reference to accompanying drawings.

DESCRIPTION OF THE EMBODIMENTS

Figure 1:
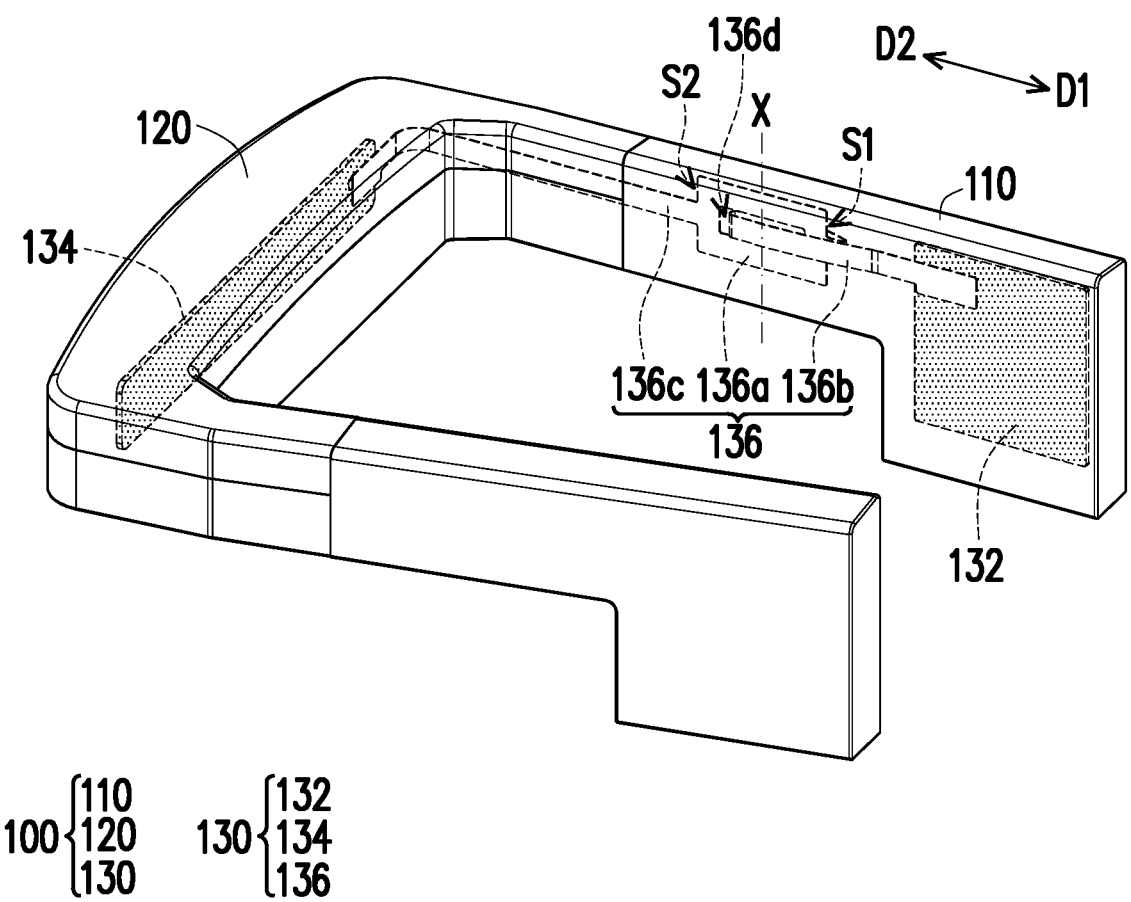
FIG. 1 is a schematic view of an electronic device according to an embodiment of the invention.
Figure 2:
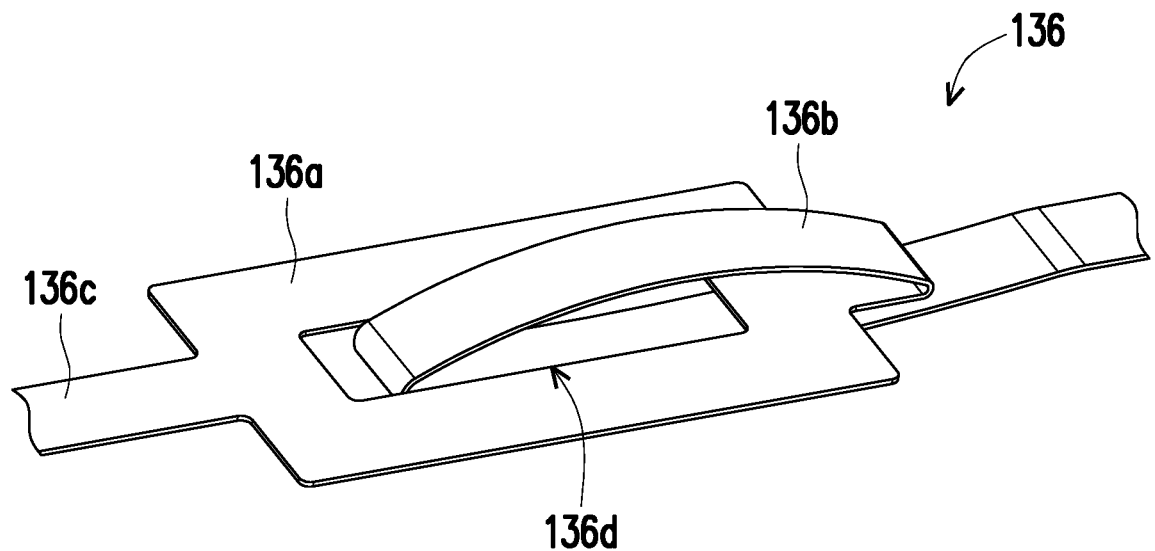
FIG. 2 is a schematic view of a flexible printed circuit board in the electronic device of FIG. 1.
Figure 3:
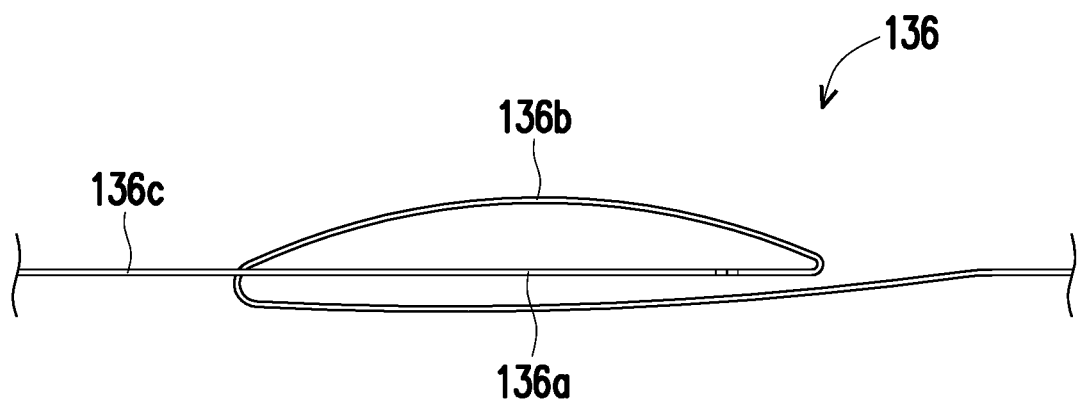
FIG. 3 is a side view of the flexible printed circuit board of FIG. 2.

FIG. 1 is a schematic view of an electronic device according to an embodiment of the invention. FIG. 2 is a schematic view of a flexible printed circuit board in the electronic device of FIG. 1. FIG. 3 is a side view of the flexible printed circuit board of FIG. 2. It should be noted that FIG. 1 shows a schematic view of a second casing of the electronic device retracting relative to a first casing.

With reference to FIG. 1, FIG. 2 and FIG. 3 at the same time, an electronic device 100 includes a first casing 110, a second casing 120 and a printed circuit board combination 130. The first casing 110 may be a shell of a reality display. The reality display may be a reality display such as virtual reality (VR), mixed reality (MR), augmented reality (AR) and the like, and is selected according to demands. Since these reality displays are usually worn on a head of a user for use, it may be seen that, in order to fasten the electronic device 100 to the head of the user well, the first casing 110 and the second casing 120 of the electronic device 100 are assembled together in a relatively movable manner, and the printed circuit board combination 130 is disposed in a space of the first casing 110 and the second casing 120.

In detail, the printed circuit board combination 130 includes a first printed circuit board 132, a second printed circuit board 134 and a flexible printed circuit board 136. The first printed circuit board 132 is fixed in the first casing 110, and the second printed circuit board 134 is fixed in the second casing 120. The flexible printed circuit board 136 has a body portion 136a, a first extending end 136b and a second extending end 136c. The body portion 136a has an opening 136d. The first extending end 136b bends from a first side S1 of the body portion 136a toward the body portion 136a and extends toward a first direction D1 after passing through the opening 136d to connect the first printed circuit board 132. The second extending end 136c extends from a second side S2 of the body portion 136a toward a second direction D2 to connect the second printed circuit board 134.

Based on the above, the first side S1 and the second side S2 are two opposite sides of the body portion 136a. The second direction D2 is a reverse direction of the first direction D1. In addition, the first extending end 136b and the second extending end 136c are symmetrically disposed on two opposite sides of the body portion 136a. The "symmetrically disposed" here refers to a fact that before the first extending end 136b of the flexible printed circuit board 136 is folded back to pass through the opening 136d (that is, a condition where the flexible printed circuit board 136 is flattened), the body portion 136a is folded with an axis X of the body portion 136a as a center of symmetry, the first extending end 136b and the second extending end 136c will completely overlap in height, lengths of the first extending end 136b and the second extending end 136c may be completely or not completely the same, and may be changed according to actual demands.

Figure 3A:
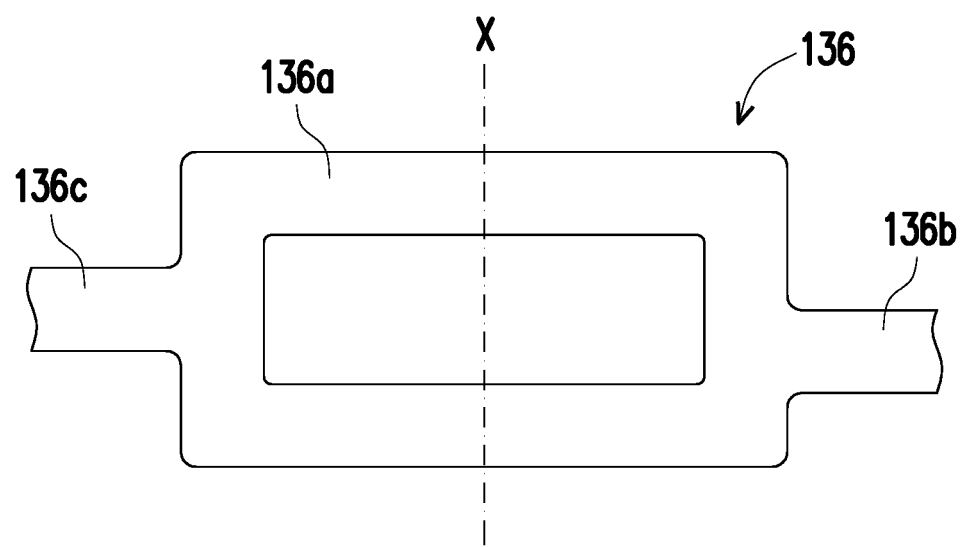
FIG. 3A is a schematic view of the flexible printed circuit board in a staggered manner.

Alternatively, in other embodiments as shown in FIG. 3A, the first extending end 136b and the second extending end 136c may also be disposed in a staggered manner in a width direction of the body portion 136a. The "disposed in a staggered manner" here refers to a fact that the body portion 136a is folded with the axis X as a center of the fold, the first extending end 136b and the second extending end 136c only partially overlap in height, or even do not overlap at all.

With reference to FIG. 1, FIG. 2 and FIG. 3, the aforementioned first extending end 136b bends toward the body portion 136a and extends toward the first direction D1 after passing through the opening 136d to connect the first printed circuit board 132. As shown in FIG. 3, the bent flexible printed circuit board 136 is in a shape similar to a lying 1 shape. In a state where the second casing 120 retracts relative to the first casing 110 as shown in FIG. 1, the first extending end 136b occupies most of a range in the opening 136d.

Incidentally, when a position of the body portion 136a is in the first casing 110, a degree of curling of the first extending end 136b is limited by an internal structure (for example, a thickness of an internal space) of the first casing 110. Alternatively, when the position of the body portion 136a is in the second casing 120, the degree of curling of the first extending end 136b is limited by an internal structure of the second casing 120. In addition, during a reciprocating motion of extension or retraction of the second casing 120 relative to the first casing 110, the second extending end 136c pulls the body portion 136a to reciprocate, thereby changing the degree of curling of the first extending end 136b in the opening 136d, so that a total length of the flexible printed circuit board 136 may be adaptively changed with the reciprocating motion of the first casing 110 and the second casing 120.

Incidentally, a width of the first extending end 136b and a width of the second extending end 136c are less than a width of the body portion 136a, and the width of the first extending end 136b may be the same as or different from the width of the second extending end 136c. A width of the opening 136d needs to be greater than the width of the first extending end 136b, so that the first extending end 136b may move freely in the opening 136d without being interfered by the opening 136d.

Of course, if there are other considerations, it is also possible to make the width of the opening 136d the same as the width of the first extending end 136b or make the width of the opening 136d slightly greater than the width of the first extending end 136b under a condition that the opening 136d interferes with the first extending end 136b.

Figure 4:
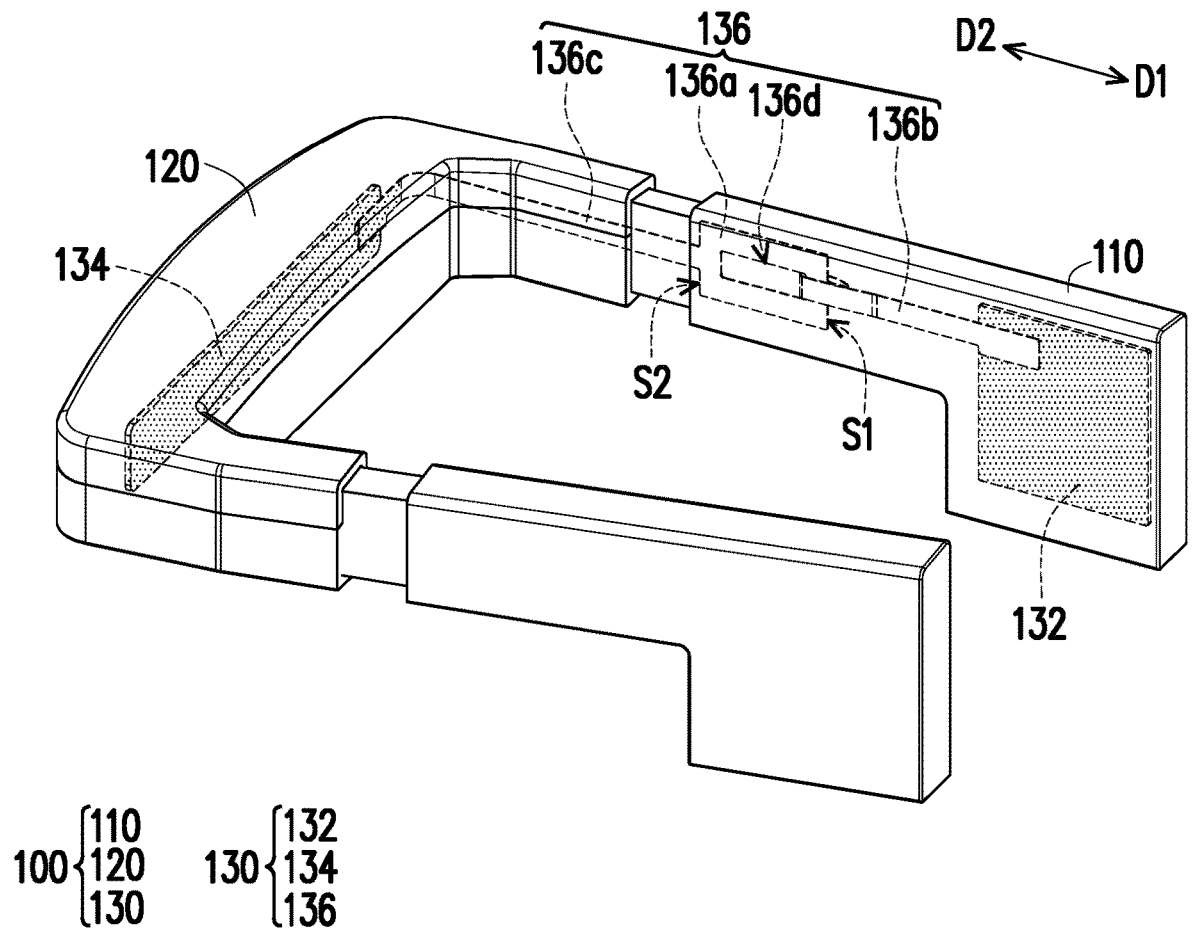
FIG. 4 is a schematic view of a first casing of the electronic device of FIG. 1 extending relative to a second casing.
Figure 5:
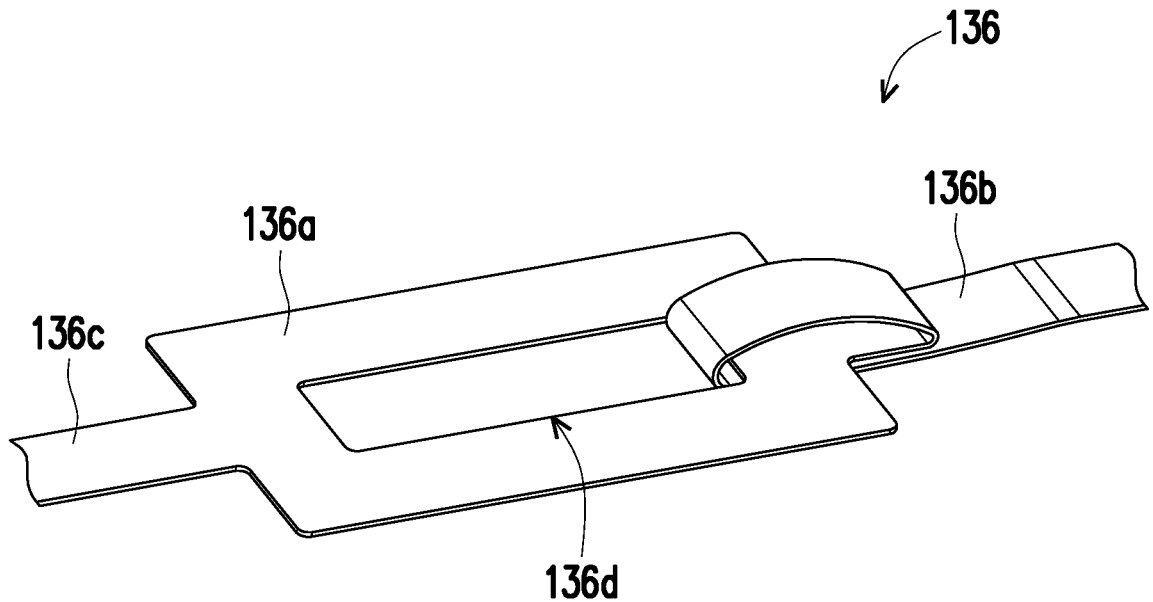
FIG. 5 is a schematic view of the flexible printed circuit board of FIG. 4.
Figure 6:
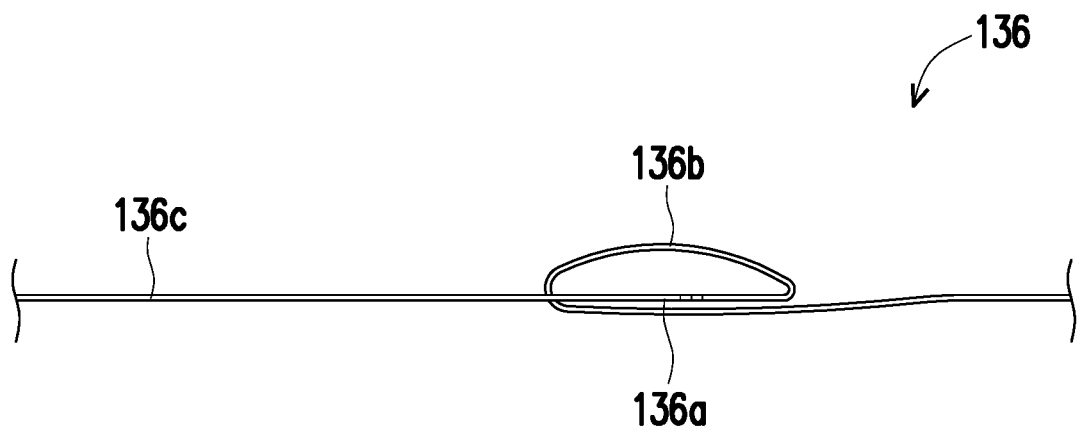
FIG. 6 is a side view of the flexible printed circuit board of FIG. 5.

FIG. 4 is a schematic view of the first casing 110 of the electronic device 100 of FIG. 1 extending relative to the second casing 120. FIG. 5 is a schematic view of the flexible printed circuit board 136 of FIG. 4. FIG. 6 is a side view of the flexible printed circuit board 136 of FIG. 5. With reference to FIG. 1, FIG. 4 and FIG. 5 at the same time, when the user makes the second casing 120 of the electronic device 100 extend relative to the first casing 110, because the second extending end 136c of the flexible printed circuit board 136 is connected to the second printed circuit board 134, as the second casing 120 extends relative to the first casing 110, a distance between the second printed circuit board 134 and the first printed circuit board 132 becomes longer, and the second extending end 136c fixed to the second printed circuit board 134 is driven by the second casing 120 so as to pull the body portion 136a to move toward the second direction D2 along with the motion of the second casing 120, so that a portion of the first extending end 136b overlapping the opening 136d of the body gradually decreases.

At this time, the side view of the flexible printed circuit board 136 is shown in FIG. 6. It may be seen that the portion of the first extending end 136b overlapping the opening 136d is smaller than the portion of the first extending end 136b overlapping the opening 136d in FIG. 3.

Figure 7:
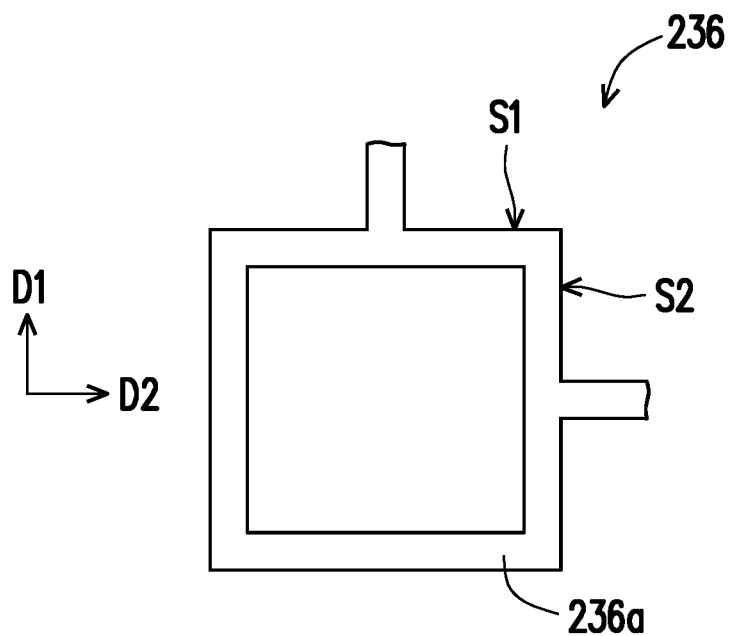
FIG. 7 is a schematic view of a flexible printed circuit board according to another embodiment of the invention.

Incidentally, in other embodiments, a first side S1 and a second side S2 of a flexible printed circuit board 236 may also be two adjacent sides of a body portion 236a. At this time, a second direction D2 is perpendicular to a first direction D1, as shown in FIG. 7. Such a printed circuit board combination 130 may be used in other electronic devices 100 that need to use the flexible printed circuit board 136 whose length may be changed due to the demand for extension and retraction.

Figure 8:
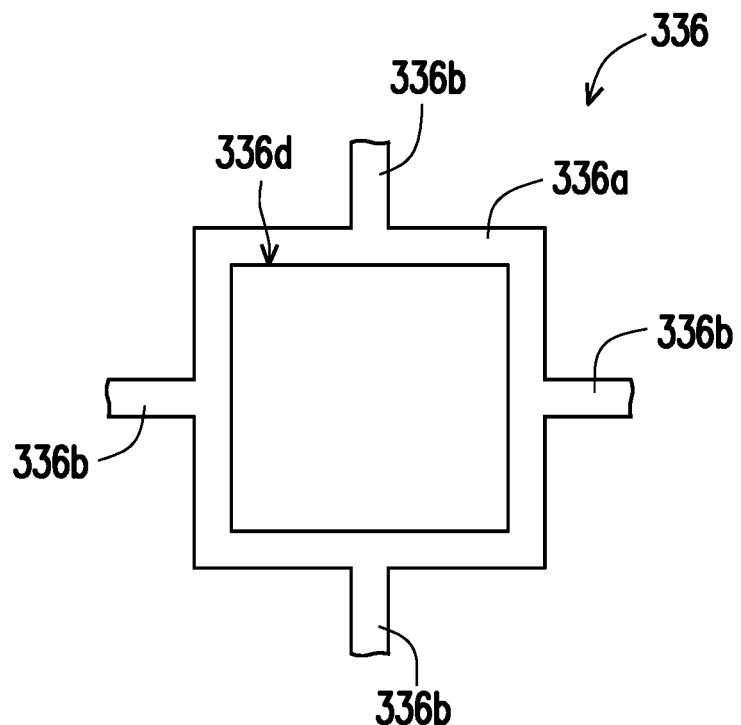
FIG. 8 is a schematic view of a flexible printed circuit board according to still another embodiment of the invention.

Various embodiments may be derived from the above, so that three sides or four sides of a body portion 336a of a flexible printed circuit board 336 have extending ends 336b, as shown in FIG. 8, and the corresponding extending ends 336b are folded back to pass through an opening 336d of the body portion 336a according to actual demands.

Based on the above, the printed circuit board combination of the invention provides a novel architecture manner, in which the opening is formed in the body portion of the flexible printed circuit board and one of the extending ends of the flexible printed circuit board is folded back to pass through the opening to be connected to the printed circuit board. By using the opening of the body portion and the extending end that is folded back to pass through the opening, the length of the flexible printed circuit board may be adaptively changed.

When the above printed circuit board combination is used in an electronic device that needs to have a retractable function, since the length of the flexible printed circuit board can be appropriately changed as the casing of the electronic device extends and retracts and the degree of curling of the extending end passing through the opening of the body portion will be adapted to the structure of the casing, the extending end of the flexible printed circuit board may be effectively prevented from being stuck or even creased due to the internal structure of the casing, causing damage to the circuit structure. Therefore, the service life of the electronic device may be effectively prolonged.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A flexible printed circuit board, configured to connect a first printed circuit board fixed in a first casing and a second printed circuit board fixed in a second casing, wherein the first casing and the second casing are assembled together in a relatively movable manner, the flexible printed circuit board comprising:
   a body portion, defining an opening;
   a first extending end, bending from a first side of the body portion toward the body portion and extending toward a first direction after passing through the opening to connect the first printed circuit board; and
   a second extending end, extending from a second side of the body portion toward a second direction to connect the second printed circuit board,
   wherein the first extending end passes over an upper surface of the body portion into the opening and then extends from a lower surface of the body portion toward the first side in the first direction,
   wherein the first extending end and the body portion overlap in an orthographic projection direction of the opening in the body portion, and the first extending end and the second extending end do not overlap in the orthographic projection direction of the opening in the body portion,
   as the second casing retracts relative to the first casing, the first extending end occupies most of a range in the opening,
   as the second casing extends relative to the first casing, a portion of the first extending end overlapping the opening of the body gradually decreases.

2. The flexible printed circuit board according to claim 1, wherein the first side and the second side are two opposite sides of the body portion, and the second direction is a reverse direction of the first direction.

3. The flexible printed circuit board according to claim 2, wherein the first extending end and the second extending end are symmetrically disposed on two opposite sides of the body portion.

4. The flexible printed circuit board according to claim 2, wherein the first extending end and the second extending end are disposed in a staggered manner in a width edge of the body portion.

5. The flexible printed circuit board according to claim 1, wherein the first extending end extends from the first side of the body portion, the second extending end extends from the second side of the body portion, and the first side and the second side are two adjacent sides of the body portion.

6. The flexible printed circuit board according to claim 1, wherein a width of the first extending end and a width of the second extending end are less than a width of the body portion.

7. The flexible printed circuit board according to claim 1, wherein a width of the opening is greater than a width of the first extending end.

8. An electronic device, comprising:
   a first casing;
   a second casing, assembled to the first casing, wherein the first casing and the second casing are assembled together in a relatively movable manner; and
   a printed circuit board combination, comprising:
      a first printed circuit board, fixed in the first casing;
      a second printed circuit board, fixed in the second casing; and
      a flexible printed circuit board, comprising:
         a body portion, defining an opening;
         a first extending end, bending from a first side of the body portion toward the body portion and extending toward a first direction after passing through the opening to connect the first printed circuit board; and
         a second extending end, extending from a second side of the body portion toward a second direction to connect the second printed circuit board,
         wherein the first extending end passes over an upper surface of the body portion into the opening and then extends from a lower surface of the body portion toward the first side in the first direction,
         wherein the first extending end and the body portion overlap in an orthographic projection direction of the opening in the body portion, and the first extending end and the second extending end do not overlap in the orthographic projection direction of the opening in the body portion,
         as the second casing retracts relative to the first casing, the first extending end occupies most of a range in the opening,
         as the second casing extends relative to the first casing, a portion of the first extending end overlapping the opening of the body gradually decreases.

9. The electronic device according to claim 8, wherein the first side and the second side are two opposite sides of the body portion, and the second direction is a reverse direction of the first direction.

10. The electronic device according to claim 9, wherein the first extending end and the second extending end are symmetrically disposed on two opposite sides of the body portion.

11. The electronic device according to claim 9, wherein the first extending end and the second extending end are disposed in a staggered manner in a width direction of the body portion.

12. The electronic device according to claim 8, wherein a width of the first extending end and a width of the second extending end are less than a width of the body portion.

13. The electronic device according to claim 8, wherein a width of the opening is greater than a width of the first extending end.

14. The electronic device according to claim 8, wherein the first extending end extends from the first side of the body portion, the second extending end extends from the second side of the body portion, and the first side and the second side are two adjacent sides of the body portion.

15. The flexible printed circuit board according to claim 4, wherein the body portion is folded with an axis as a center of the fold, and the first extending end and the second extending end only partially overlap in height, or even do not overlap at all.

* * * * *